(12) United States Patent
Ehlen et al.

(10) Patent No.: US 10,045,459 B2
(45) Date of Patent: Aug. 7, 2018

(54) SERVER PLATFORM WITH INTEGRATED POWER SUPPLY

(71) Applicant: Facebook, Inc., Menlo Park, CA (US)

(72) Inventors: Jon Brian Ehlen, Newark, CA (US); Yan Zhao, Cupertino, CA (US); Jason Taylor, Berkeley, CA (US)

(73) Assignee: Facebook, Inc., Menlo Park, CA (US)

( * ) Notice: Subject to any disclaimer, the term of this patent is extended or adjusted under 35 U.S.C. 154(b) by 6 days.

(21) Appl. No.: 15/246,312

(22) Filed: Aug. 24, 2016

(65) Prior Publication Data
US 2018/0063988 A1    Mar. 1, 2018

(51) Int. Cl.
   *H05K 7/14*    (2006.01)
   *H05K 5/02*    (2006.01)

(52) U.S. Cl.
   CPC ......... *H05K 7/1492* (2013.01); *H05K 5/0247* (2013.01); *H05K 7/1457* (2013.01); *H05K 7/1489* (2013.01)

(58) Field of Classification Search
   CPC .. H05K 7/1492; H05K 7/1489; H05K 5/0247; H05K 7/1457
   See application file for complete search history.

(56) References Cited

U.S. PATENT DOCUMENTS

| | | | | |
|---|---|---|---|---|
| 6,459,571 B1* | 10/2002 | Carteau | ................... | G06F 1/184 312/35 |
| 6,826,456 B1* | 11/2004 | Irving | ....................... | G06F 1/20 361/695 |
| 7,486,526 B1* | 2/2009 | Frangioso, Jr. | ...... | G11B 33/128 361/756 |
| 2006/0061955 A1* | 3/2006 | Imblum | .................. | G06F 1/184 361/679.33 |
| 2007/0053169 A1* | 3/2007 | Carlson | ................... | G11B 33/12 361/727 |
| 2008/0191590 A1* | 8/2008 | Lin | ....................... | G11B 33/128 312/223.2 |
| 2010/0172083 A1* | 7/2010 | Randall | ................ | G11B 33/126 361/679.31 |
| 2010/0172087 A1* | 7/2010 | Jeffery | ................... | G11B 33/02 361/679.33 |
| 2013/0050955 A1* | 2/2013 | Shinsato | ................. | G06F 1/181 361/727 |
| 2014/0265794 A1* | 9/2014 | Schroeder | ............. | H05K 7/183 312/334.46 |

* cited by examiner

*Primary Examiner* — Dimary Lopez Cruz
*Assistant Examiner* — Abhishek Rathod
(74) *Attorney, Agent, or Firm* — FisherBroyles, LLP

(57) ABSTRACT

A server platform with integrated power supply including a cubby chassis having one or more partitions defining a plurality of sled positions each configured to receive a server sled. A power supply unit is positioned in the cubby chassis and transversely oriented with respect to the one or more partitions. A power supply harness extends between the power supply unit and each of the plurality of sled positions. Therefore, the server platform can be easily connected to a power source without being mounted in a rack, thereby facilitating bench top testing of a server or servers mounted in the cubby chassis.

18 Claims, 10 Drawing Sheets

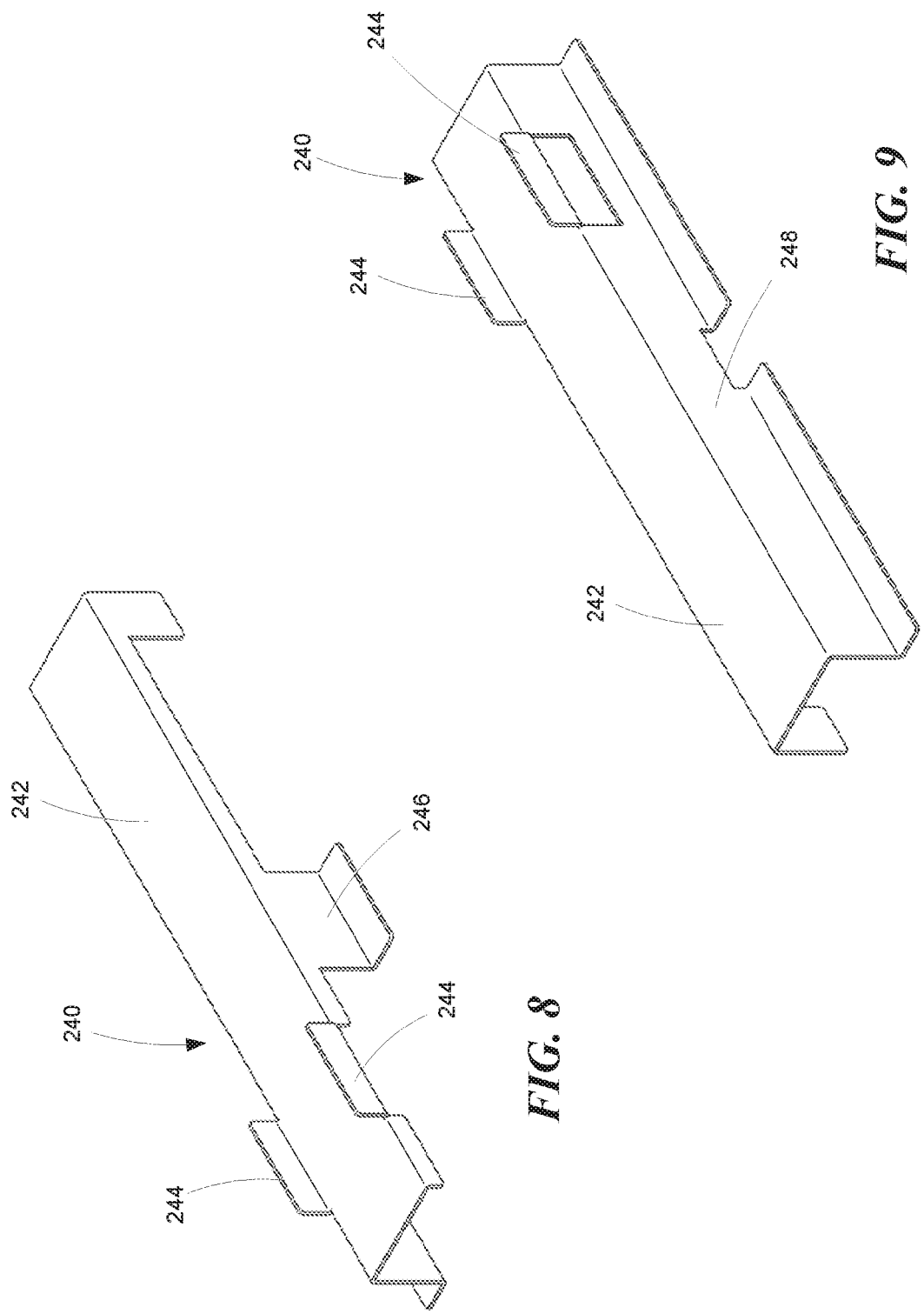

SERVER PLATFORM WITH INTEGRATED POWER SUPPLY

TECHNICAL FIELD

This patent application is directed to server platforms, and more specifically, to a server platform having an integrated power supply.

BACKGROUND

Existing server platforms generally derive their power from a power distribution unit (PDU) mounted to a rack. In some cases, the rack has a powered bus bar running the height of the rack that multiple server platforms connect to with a power input connector engaging the powered bus bar. Thus, in order to test one or more servers, the server platform must be mounted in the rack and connected to the PDU or powered bus bar. The confined space of a rack can make testing a server difficult. Accordingly, there is a need to conveniently power a server platform without installation in a rack for bench top testing.

BRIEF DESCRIPTION OF THE DRAWINGS

The server platform with integrated power supply introduced here may be better understood by referring to the following Detailed Description in conjunction with the accompanying drawings, in which like reference numerals indicate identical or functionally similar elements:

FIG. 8 is an isometric view of the support bracket shown in FIG. 7 as viewed from the front.

FIG. 9 is an isometric view of the support bracket shown in FIGS. 7 and 8 as viewed from the back.

Figure 1:
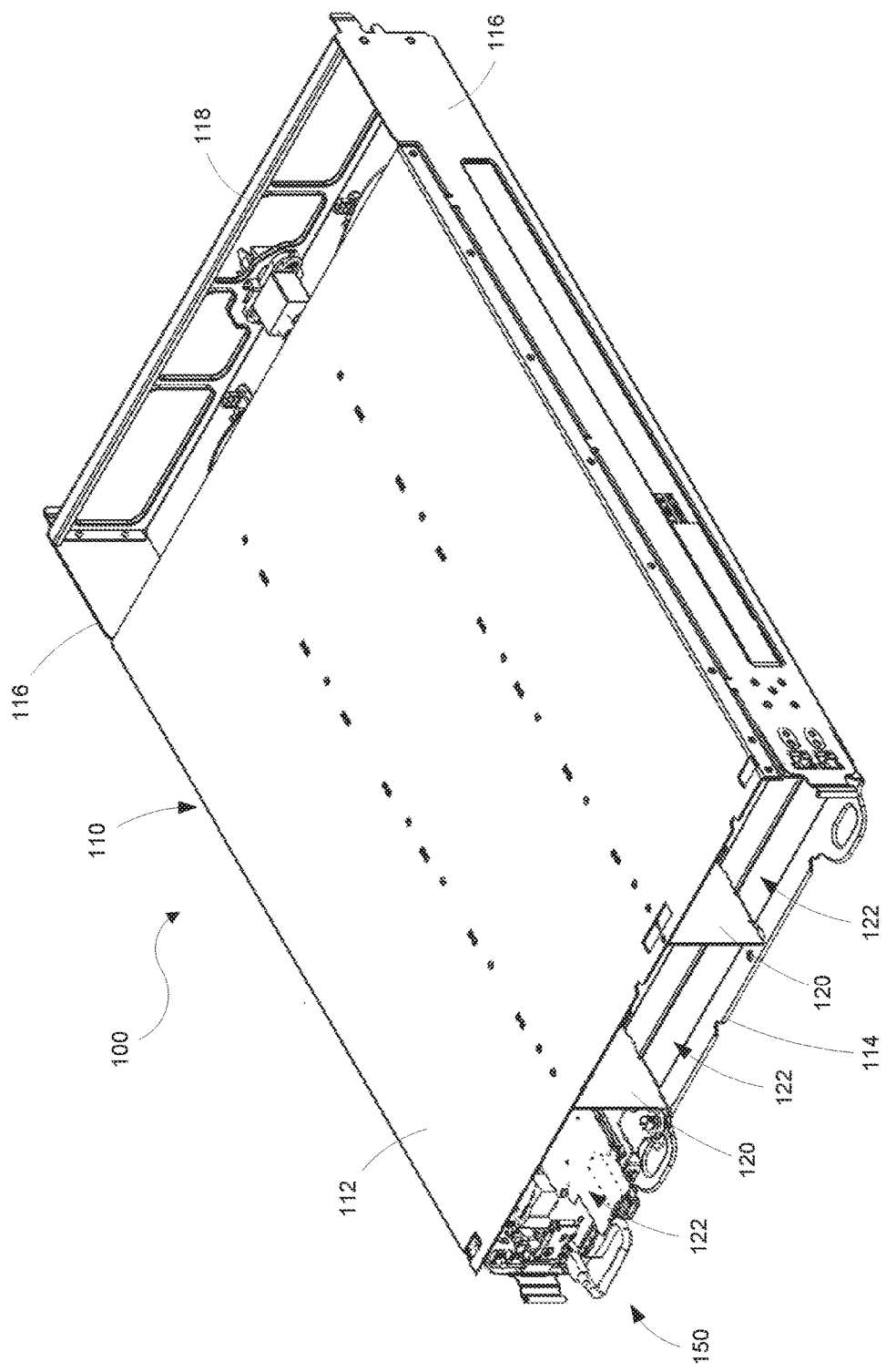
FIG. 1 is an isometric view of an existing server platform with a cubby chassis.

The headings provided herein are for convenience only and do not necessarily affect the scope of the embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of this disclosure.

DETAILED DESCRIPTION

Overview

A server platform with integrated power supply is disclosed. In an embodiment, the server platform with integrated power supply includes a cubby chassis having one or more partitions defining a plurality of sled positions each configured to receive a server sled. A power supply unit is positioned in the cubby chassis and transversely oriented with respect to the one or more partitions. A power supply harness extends between the power supply unit and each of the plurality of sled positions. Therefore, the server platform can be easily connected to a power source (e.g., wall outlet) without being mounted in a rack, thereby facilitating bench top testing of a server or servers mounted in the cubby chassis.

General Description

Various examples of the devices introduced above will now be described in further detail. The following description provides specific details for a thorough understanding and enabling description of these examples. One skilled in the relevant art will understand, however, that the techniques and technology discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates an existing rack powered server platform 100. The server platform 100 includes a cubby chassis 110 configured to mount into a component rack (not shown) and house one or more server sleds 150. The illustrated cubby chassis 110 can be a sheet metal chassis, and it includes three sled positions 122 sized and configured to receive a server sled 150 in each position. The cubby chassis 110 of other embodiments can have a greater or fewer number of sled positions 122. The cubby chassis 110 includes top and bottom panels 112 and 114, respectively, spaced apart by sidewalls 116, and end wall 118. A pair of partitions 120 are positioned between the top and bottom panels (112, 114) to divide the cubby chassis 110 into the three sled positions 122.

Figure 2:
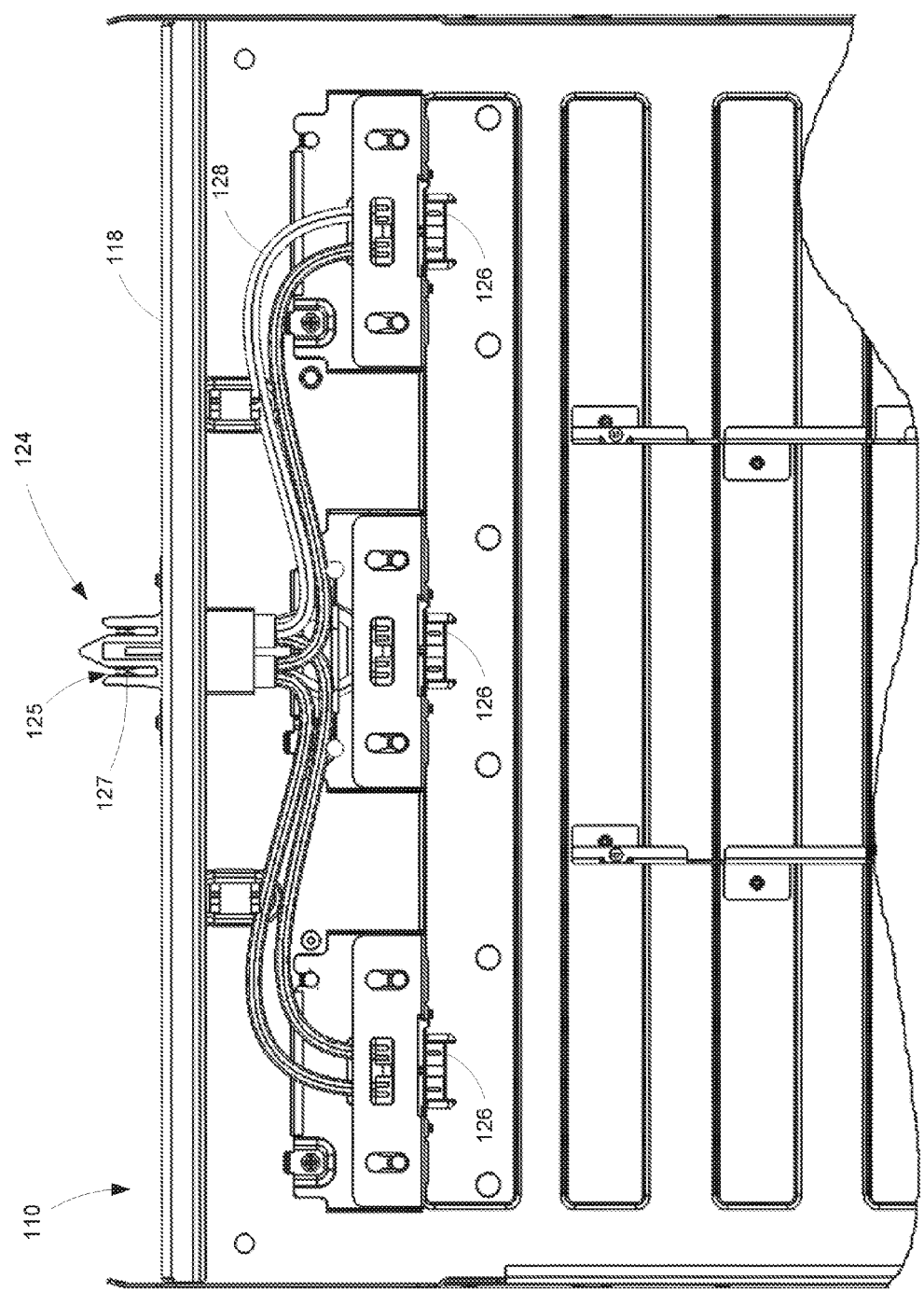
FIG. 2 is a partial, enlarged top plan view of the cubby chassis shown in FIG. 1 with the top panel removed for clarity.

With further reference to FIG. 2, the cubby chassis 110 includes a power input connector 124 attached to the end wall 118 of the cubby chassis 110. In some embodiments, the power input connector 124 includes a pair of slots 125 containing contacts 127 that engage or clip onto a corresponding power bus bar (not shown). The power input connector 124 is connected to three cubby connectors 126 via a power cable assembly 128. The rack powered server platform 100 is further described in U.S. patent application Ser. No. 15/063,024, filed Mar. 7, 2016, and entitled MULTI-NODE SERVER PLATFORM, the disclosure of which is incorporated herein by reference in its entirety.

Figure 3:
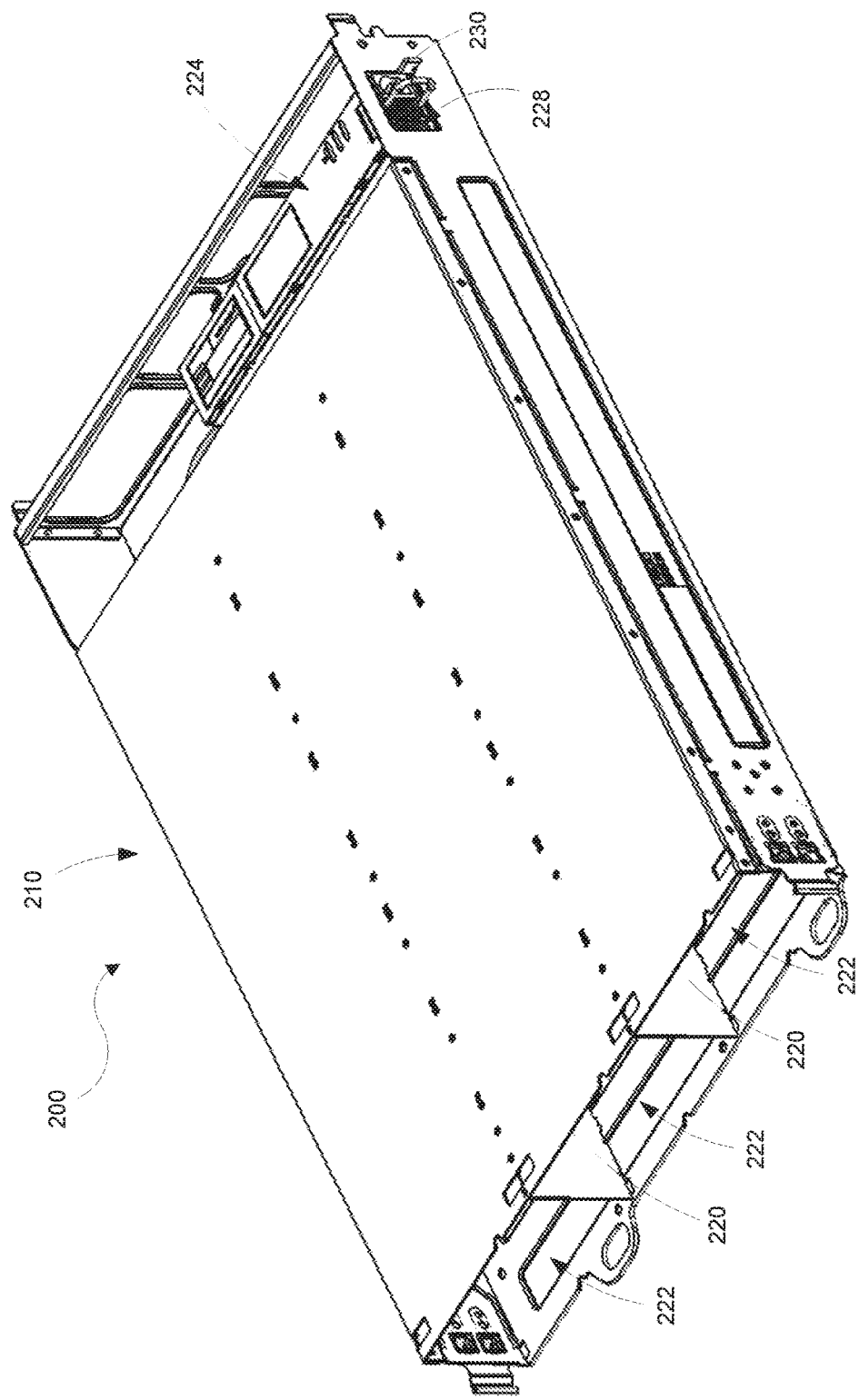
FIG. 3 is an isometric view of a server platform with an integrated power supply according to a representative embodiment.

FIG. 3 illustrates a server platform 200 with an integrated power supply unit 224. The power supply unit 224 is positioned in the cubby chassis 210 behind the sled positions 222 and transversely oriented with respect to the partitions 220. Thus, the server platform 200 has a self-contained power supply. In some embodiments, the power supply unit 224 is a standard 1U 19 inch rack unit power supply. One end of the power supply unit 224 is accessible through a connector opening 228 in cubby chassis 210. The power supply unit 224 can include a power cable connection 230 to connect the power supply to a wall outlet, for example, via a standard C13 style power cord (not shown). Therefore, the server platform 200 can be easily connected to a power source without being mounted in a rack, thereby facilitating bench top testing of a server or servers mounted in the cubby chassis 210. Accordingly, the power supply unit 224 is moveable with the server platform 200 in contrast to the rack powered platform where the power supply is mounted to the rack and moveable with the rack.

Figure 4:
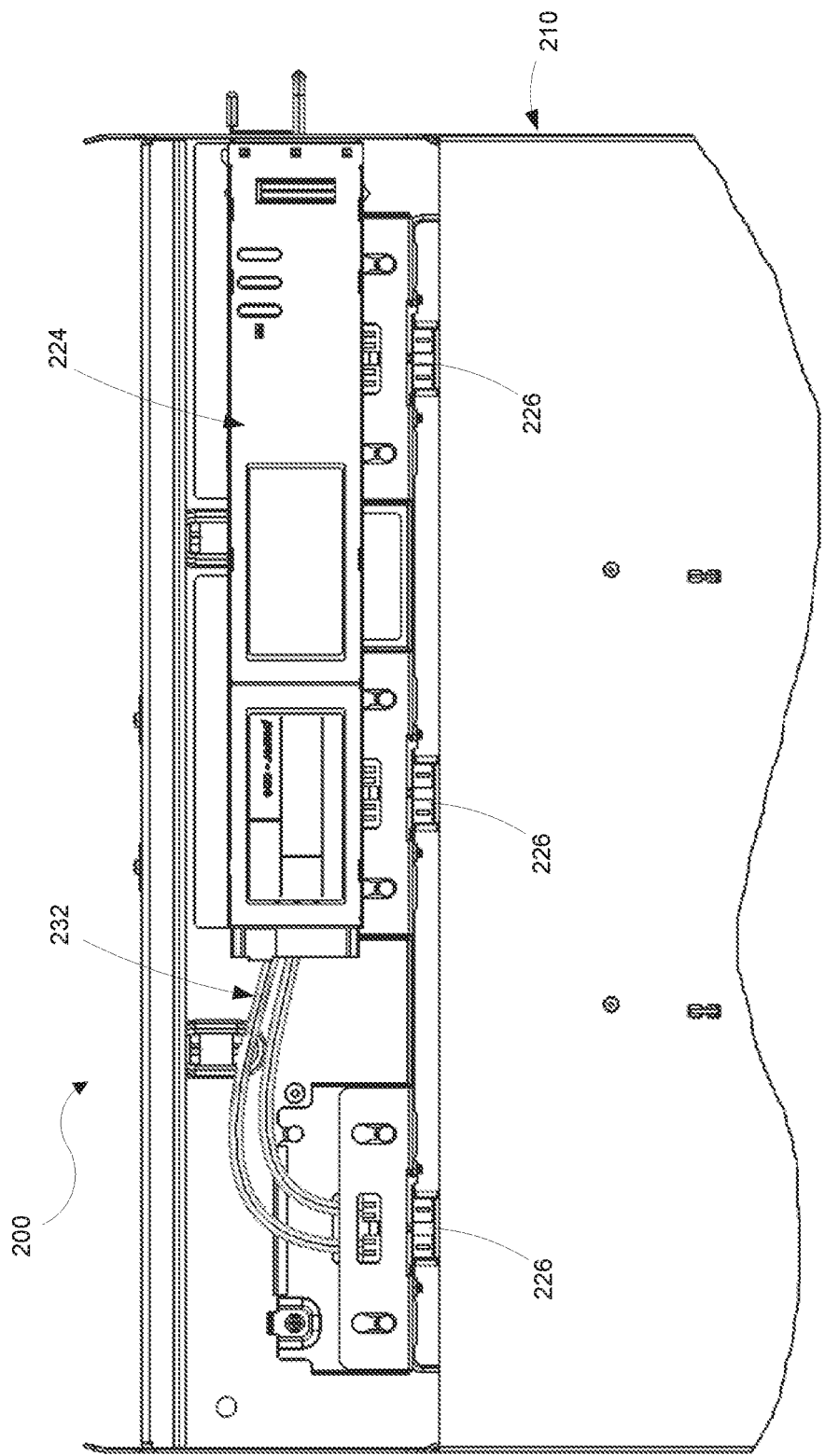
FIG. 4 is a partial, enlarged top plan view of the cubby chassis shown in FIG. 3 with the top panel removed for clarity.
Figure 5:
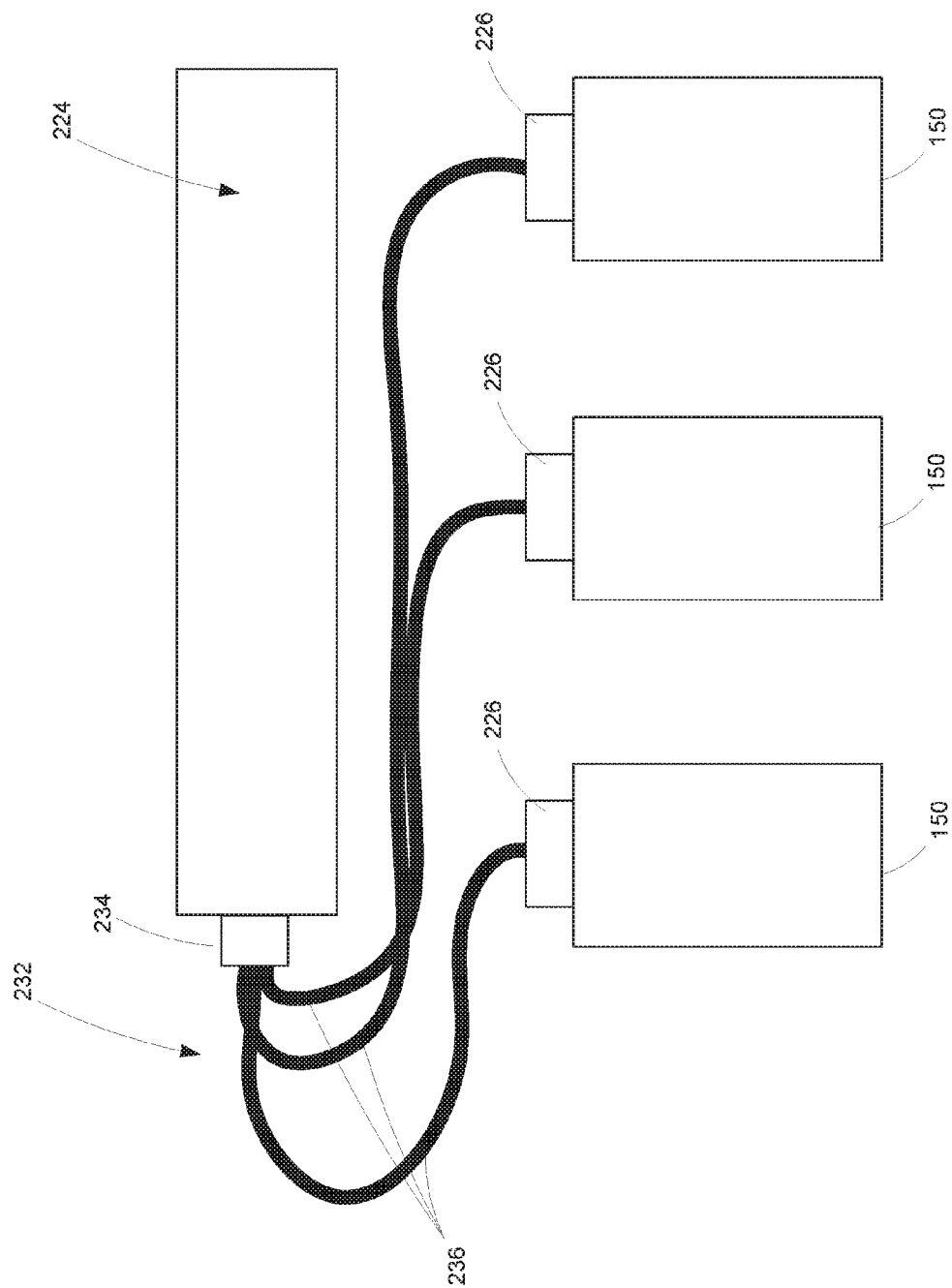
FIG. 5 is a schematic representation of the power supply harness shown in FIG. 4.

In some embodiments, the server platform 200 with the integrated power supply is initially configured with the integrated power supply. In other embodiments, an existing server platform, such as server platform 100, described above with respect to FIGS. 1 and 2, can be modified or converted to include the integrated power supply. As shown in FIG. 4, the power input connector 124 and associated cable assembly 128 (FIG. 2) have been omitted or removed to make room for the power supply unit 224, which connects to a power supply harness 232 to provide power to cubby connectors 226. With further reference to FIG. 5, the power supply harness 232 extends between the power supply unit 224 and the three cubby connectors 226 corresponding to each of the plurality of sled positions. The power supply harness 232 includes a power unit connector 234, supply cables 236 extending from the power unit connector 234, and cubby connectors 226 connected to the supply cables 236. The cubby connectors 226 can connect to one or more server sleds 150. In some embodiment, the server platform 200 can be converted back to a rack powered platform, such as server platform 100, by removing the power supply 224 and reinstalling the power input connector 124 and associated cable assembly 128.

Figure 6:
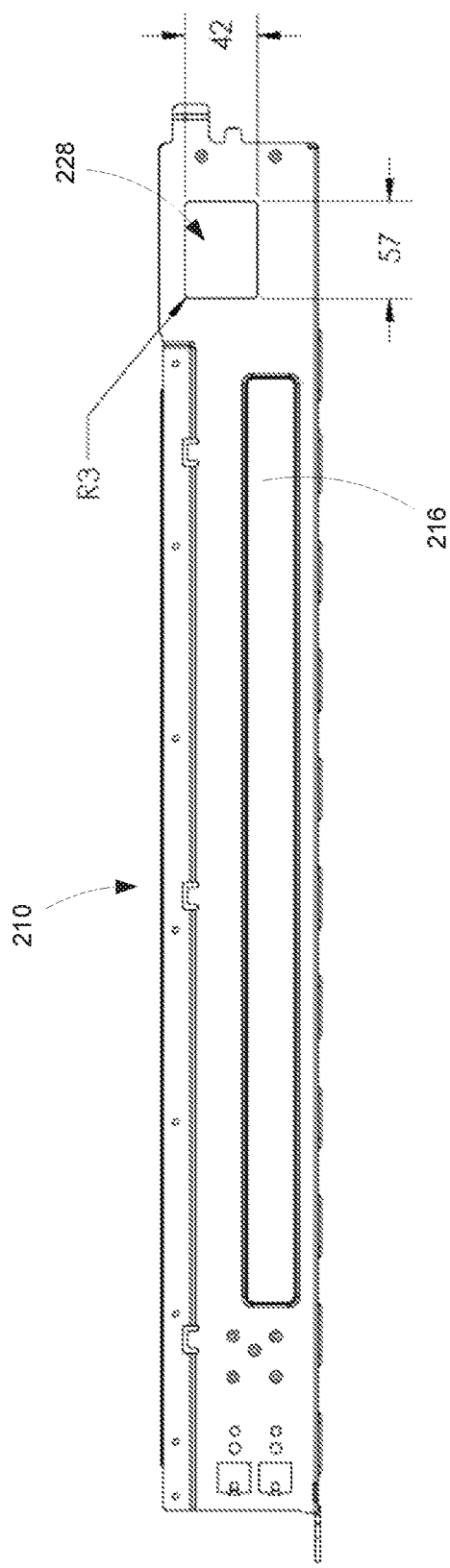
FIG. 6 is a side view in elevation of the cubby chassis shown in FIGS. 3 and 4.

FIG. 6 includes example dimensions for the connector opening 228 according to a representative embodiment. However, these dimensions should not be interpreted as limiting, and other suitable dimensions may be used. In at least one embodiment, the connector opening 228 has a width of 57 mm and a height of 42 mm. In some embodiments, the corners of the connector opening 228 have a 3 mm radius. The connector opening 228 can be cut through sidewall 216 after the cubby chassis 210 is assembled or can be formed into the sidewall 216 when the sidewall is manufactured through punching and stamping, for example.

Figure 7:
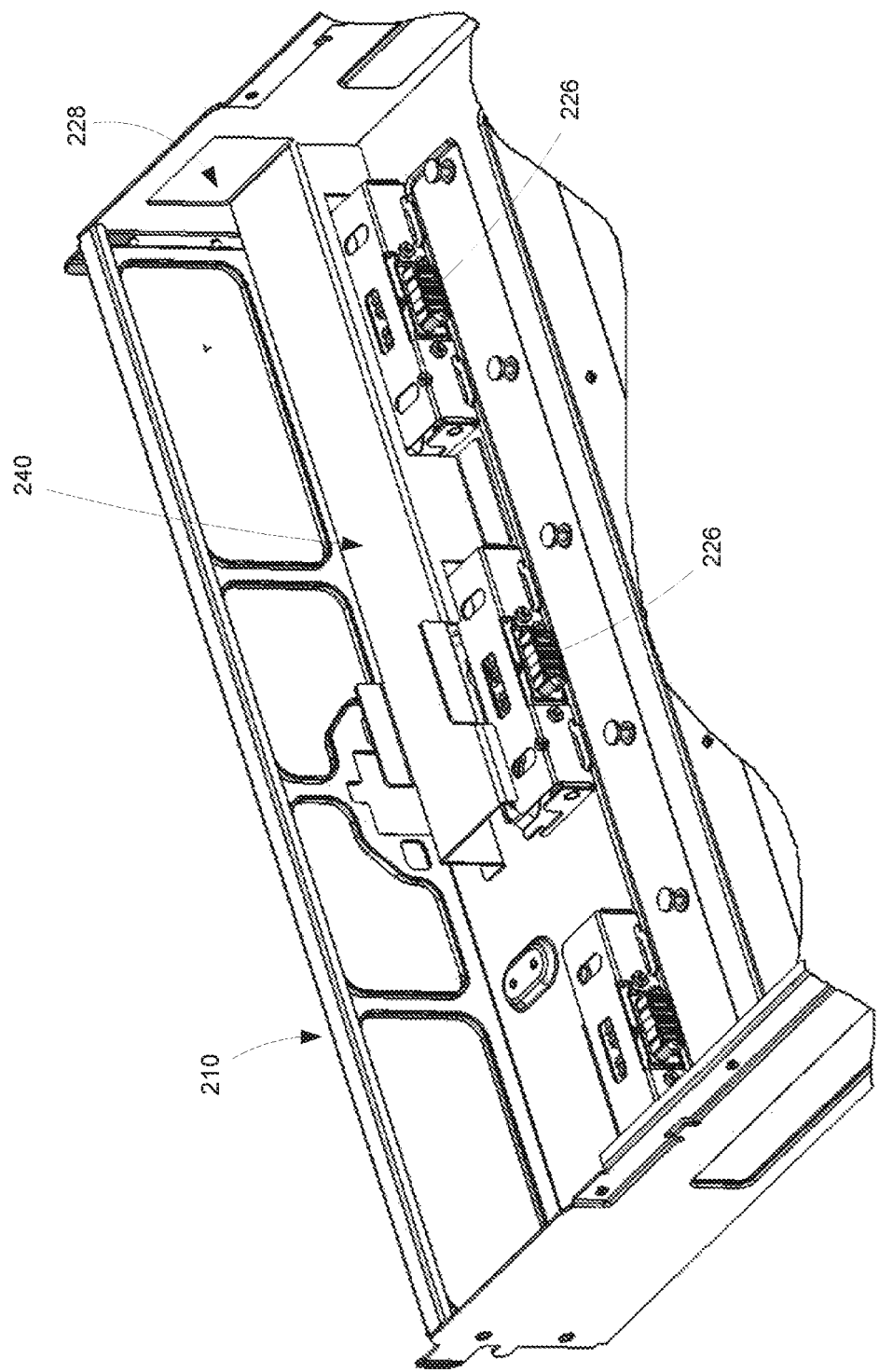
FIG. 7 is a partial isometric view of the cubby chassis shown in FIG. 6.
Figure 12:
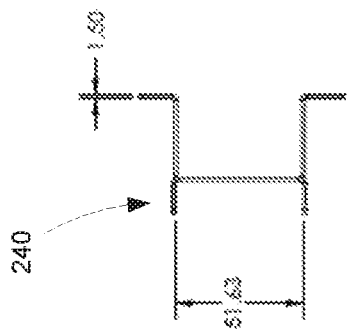
FIG. 12 is an end view of the support bracket shown in FIGS. 7-11.
Figure 11:
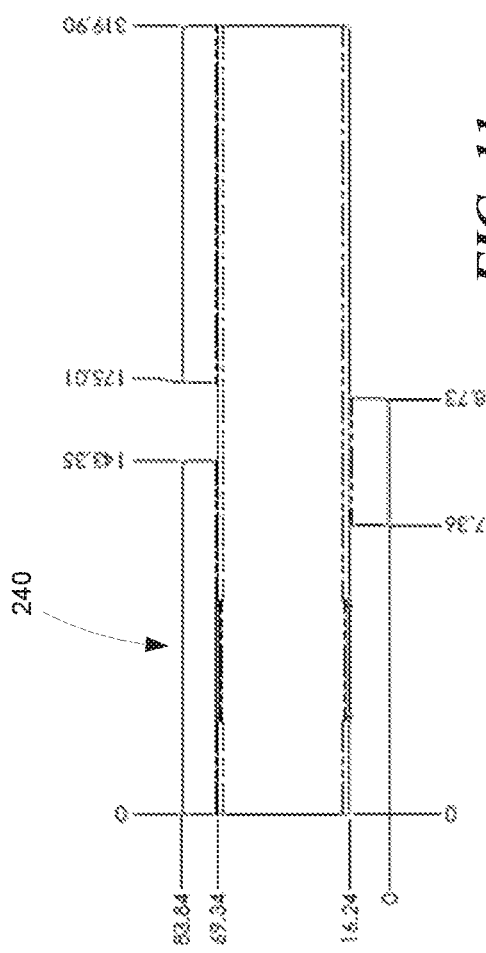
FIG. 11 is a top plan view of the support bracket shown in FIGS. 7-10.
Figure 10:
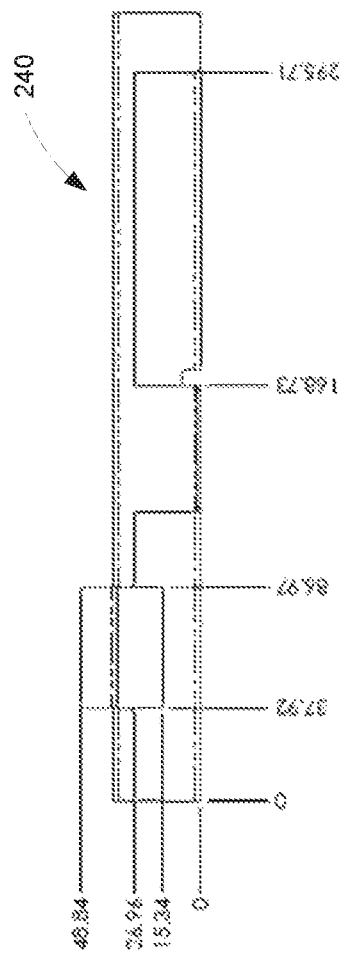
FIG. 10 is a front view of the support bracket shown in FIGS. 7-9.

As shown in FIG. 7, a support bracket 240 is mounted to the cubby chassis 210 for supporting the power supply unit 224 (FIG. 4) above the cubby connectors 226. The support bracket 240 is mounted adjacent the connector opening 228. In some embodiments, the support bracket 240 is attached to the cubby chassis 210 with suitable fasteners. With further reference to FIGS. 8 and 9, the support bracket 240 includes a support surface 242 and guide tabs 244 to position the power supply unit 224 (FIG. 4) on the support surface 242. The support surface 242 is elevated above the cubby chassis 210 by flanges 246 and 248. FIGS. 10-12 include example dimensions for the support bracket 240 according to a representative embodiment. However, these dimensions should not be interpreted as limiting, and other suitable dimensions may be used.

Figure 13:
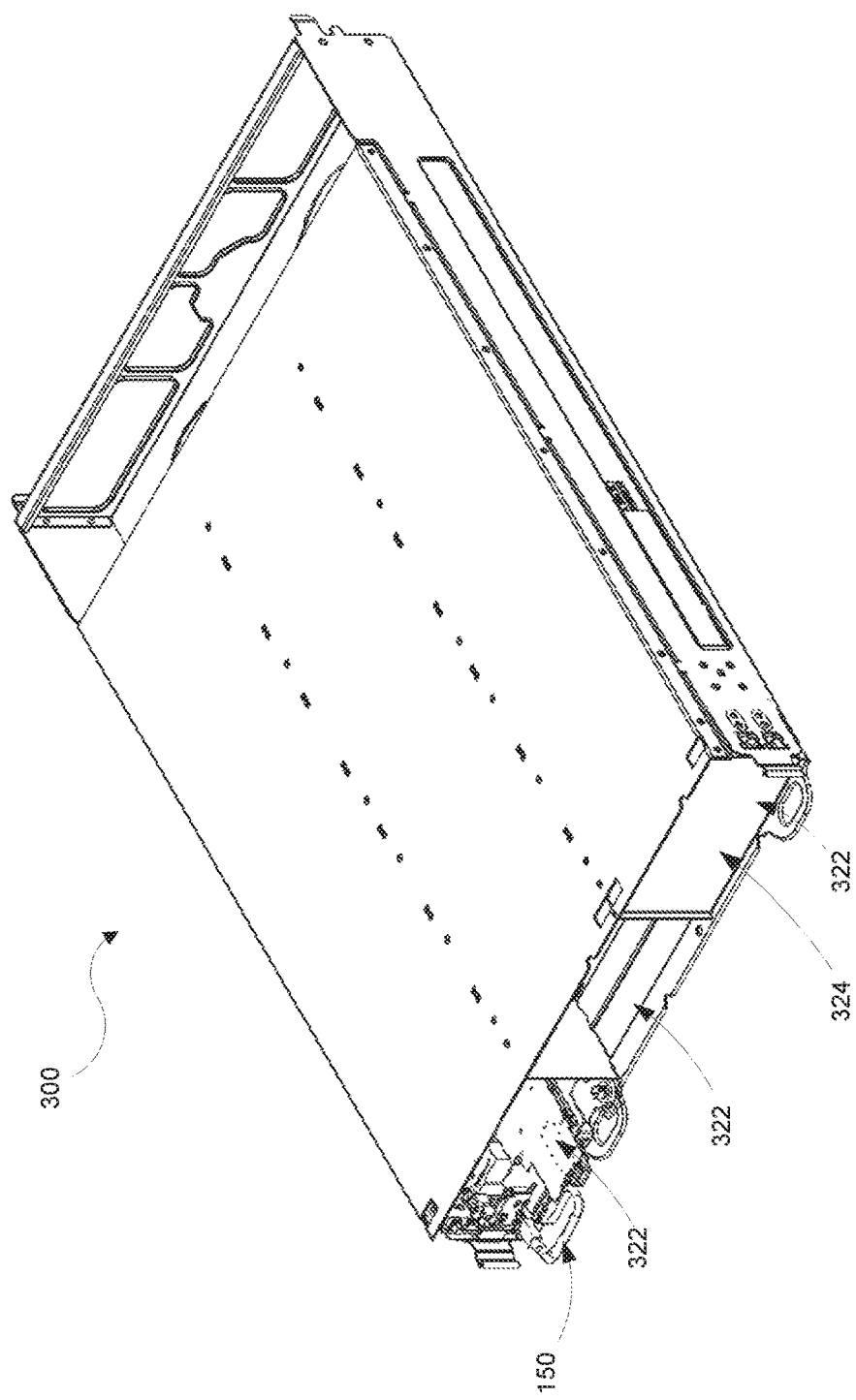
FIG. 13 is an isometric view of a server platform with an integrated power supply according to another representative embodiment.

FIG. 13 illustrates a server platform 300 with an integrated power supply unit 324 according to another representative embodiment. In this embodiment, the power supply unit 324 is located in one of the sled positions 322. The power supply unit 324 can be connected to the server sled(s) 150 with a suitable harness (not shown) similar to that described above with respect to FIGS. 4 and 5.

Remarks

The above description, drawings, and appendices are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A server system, comprising:
   a cubby chassis including one or more partitions defining a plurality of sled positions;
   at least one server sled located in a corresponding one of the plurality of sled positions;
   a power supply unit positioned in the cubby chassis and transversely oriented with respect to the one or more partitions;
   a power supply harness extending between the power supply unit and each of the plurality of sled positions to supply power to the at least one server sled;
   a plurality of cubby connectors, each corresponding to one of the plurality of sled positions; and a support bracket mounted to the cubby chassis supporting the power supply unit above the cubby connectors.

2. The server system of claim 1, wherein the power supply unit extends through an opening of a sidewall of the cubby chassis.

3. The server system of claim 2, wherein the support bracket is mounted adjacent the opening of the sidewall of the cubby chassis.

4. The server system of claim 1, wherein the support bracket comprises:
a support surface; and
guide tabs configured to position the power supply unit on the support surface.

5. The server system of claim 1, wherein the cubby chassis includes a top panel, a bottom panel, and a pair of sidewalls.

6. The server system of claim 1, wherein:
the plurality of cubby connectors are connected to the power supply unit; and
the at least one server sled includes a sled connector mated with a corresponding one of the plurality of cubby connectors.

7. The server system of claim 1, wherein the cubby chassis is configured for mounting in a component rack.

8. A server platform, comprising:
a cubby chassis including one or more partitions defining a plurality of sled positions each configured to receive a server sled;
a power supply unit positioned in the cubby chassis and transversely oriented with respect to the one or more partitions;
a power supply harness extending between the power supply unit and each of the plurality of sled positions;
a plurality of cubby connectors, each corresponding to one of the plurality of sled positions; and
a support bracket mounted to the cubby chassis supporting the power supply unit above the cubby connectors.

9. The server platform of claim 8, wherein the power supply unit extends through an opening of a sidewall of the cubby chassis.

10. The server platform of claim 9, wherein the support bracket is mounted adjacent the opening of the sidewall of the cubby chassis.

11. The server platform of claim 8, wherein the support bracket comprises:
a support surface; and
guide tabs configured to position the power supply unit on the support surface.

12. The server platform of claim 8, wherein the cubby chassis includes a top panel, a bottom panel, and a pair of sidewalls.

13. The server platform of claim 8, wherein the plurality of cubby connectors are connected to the power supply unit.

14. The server platform of claim 8, wherein the cubby chassis is configured for mounting in a component rack.

15. A method for converting a rack powered server platform to include an integrated power supply unit, the server platform including a cubby chassis having one or more partitions defining a plurality of sled positions and at least one server sled located in a corresponding one of the plurality of sled positions, the method comprising:
removing an existing power input connector and an existing cable assembly from the cubby chassis;
modifying a sidewall of the cubby chassis to include a power supply access opening;
mounting a support bracket in the cubby chassis adjacent the power supply access opening;
mounting a power supply unit to the support bracket such that power supply unit is positioned in the cubby chassis and transversely oriented with respect to the one or more partitions; and
connecting a power supply harness to the power supply unit, wherein:
the power supply harness extends between the power supply unit and each of the plurality of sled positions to supply power to the at least one server sled;
the power supply harness includes a plurality of cubby connectors, each corresponding to one of the plurality of sled positions; and
the support bracket supports the power supply unit above the cubby connectors.

16. The method of claim 15, wherein modifying the sidewall of the cubby chassis includes cutting the sidewall.

17. The method of claim 15, further comprising positioning each cubby connector adjacent a corresponding one of the plurality of sled positions.

18. The method of claim 15, further comprising extending at least a portion of the power supply unit through the power supply access opening.

\* \* \* \* \*